United States Patent

[11] 3,611,259

[72] Inventor Vincent James Palecek
Cicero, Ill.
[21] Appl. No. 846,496
[22] Filed July 31, 1969
[45] Patented Oct. 5, 1971
[73] Assignee The Bunker-Ramo Corporation
Oak Brook, Ill.

[54] ZERO INSERTION FORCE RECEPTACLE FOR FLAT CIRCUIT BEARING ELEMENTS
2 Claims, 5 Drawing Figs.

[52] U.S. Cl. ........ 339/74 R, 339/176 MP
[51] Int. Cl. ........ H01r 13/62
[50] Field of Search ........ 339/17, 74, 75, 176

[56] References Cited

UNITED STATES PATENTS

| | | | |
|---|---|---|---|
| 3,489,990 | 1/1970 | Parker et al. | 339/75 MP |
| 3,495,132 | 2/1970 | Anhalt et al. | 317/101 |

FOREIGN PATENTS

| | | | |
|---|---|---|---|
| 1,073,056 | 1/1960 | Germany | 339/75 MP |
| 1,118,852 | 12/1961 | Germany | 339/74 |
| 1,125,990 | 3/1962 | Germany | 339/17 LM |
| 1,147,037 | 4/1969 | Great Britain | 339/74 |

*Primary Examiner*—Joseph H. McGlynn
*Attorney*—Frederick M. Arbuckle

ABSTRACT: A zero insertion and withdrawal force receptacle for flat circuit bearing elements such as printed circuit boards. A slot is provided in the receptacle which is adapted to receive the element. At least one contact is normally biased to make physical and electrical contact with the element when it is in the slot and a cam is provided which is operable to cam the contact to a position where it does not contact the element when the element is either partially or fully inserted in the slot.

INVENTOR
VINCENT JAMES PALECEK
BY
Ronald J. Kransdorf
ATTORNEY

ZERO INSERTION FORCE RECEPTACLE FOR FLAT CIRCUIT BEARING ELEMENTS

This invention relates to receptacles for flat circuit bearing elements, such as printed circuit boards or thick film and thin film substrates, and more particularly to a receptacle for these elements which exerts zero force on the element when it is being inserted into and withdrawn from the receptacle.

With the miniaturization of electronic circuits, many circuits are now either printed, deposited or otherwise formed on either or both surfaces of a board or similar substrate. In use, these boards are fitted into suitable receptacles which receptacles are then interconnected and connected to other circuit elements to form complex electronic devices. In order to permit electrical contact with the receptacle, a plurality of contact points are provided along one edge of the printed circuit board. These contact points generally appear on both sides of the board and are generally in the form of strips of conductive material to which circuitry on the board may be connected.

Since a large amount of electrical circuitry may appear on a single printed circuit or like board, each board requires a substantial number of contact points. There could, for example, be several hundred contact points on a single board. Standard receptacles used heretofore with printed circuit boards utilize contact members which are mechanically biased to engage the board and its terminal strips (contact points) with a predetermined force. This force is exerted to make good electrical contact with the board when the board is in the receptacle but is also exerted when the board when the board is inserted and removed from the receptacle. While the force exerted by each one of these contacts is not very great, the combined force of several hundred contacts is substantial and may, in fact, make insertion and removal of the board difficult or impossible. Therefore, with standard receptacles, the number of contact points on a board must be restricted in order to permit easy insertion and removal of the boards.

Another problem with existing receptacles is that the contacts rub against the terminal strips of the printed circuit board during insertion and removal of the board. Since the terminal strips of a typical board are only a few thousandths of an inch thick, this rubbing of the contacts against the terminal strips during insertion and removal of the boards tends to wear away the terminal strips and may well ruin a circuit board after several insertions and removals. The friction between the boards and the receptacle contacts may also wear away precious metal plated on the contact surface or otherwise damage the contacts. This tends to reduce the useful life of the receptacle. The contact and terminal strip wear resulting from insertion and removal of boards with standard receptacles thus necessitates the replacement of expensive elements and may well lead to difficult-to-detect failures in the electronic equipment utilizing the boards. Another related problem occurs when the element being utilized is a ceramic substrate such as is used with thin film and thick film circuits. These substrates are relatively fragile and may be chipped, cracked or broken in attempting to force them between the contacts of a standard receptacle.

It is therefore a primary object of this invention to provide an improved receptacle for flat circuit bearing elements such as printed circuit boards and film substrates.

A more specific object of this invention is to provide a receptacle for thin circuit bearing elements which receptacle has contacts which do not apply any force to the element during insertion and removal.

Some attempt has been made in the past to design receptacles for printed circuit boards and the like which exert zero force on the board during insertion and removal. However, these devices have been relatively complex, bulky, expensive, and heavy. In addition, in most of these devices, the contacts have been normally biased away from the board during insertion and removal and have been cammed into contact with the board when it is properly seated. Since the boards may vary slightly in thickness, or may be slightly warped, this mode of operation results in a greater force being applied to thicker boards and a lesser force being applied to thinner boards. Excessive force on a thicker board may damage the contact on the terminal strip coating, or, in the case of a ceramic board, the board itself. Too little force may result in a poor electrical contact which can cause troublesome intermittent errors in the equipment utilizing the board.

A more specific object of this invention is therefore to provide an improved zero insertion and removal force receptacle for flat circuit bearing elements.

Another object of this invention is to provide a receptacle of the type indicated above which is relatively simple, compact light, and inexpensive.

Still another object of this invention is to provide a receptacle of the type indicated above which causes a uniform force to be applied to the circuit board terminal strips in spite of slight variations in board thickness or board warpage.

In accordance with these objects this invention provides a receptacle for flat circuit bearing elements having contact points along at least one edge thereof. The receptacle includes a slot adapted to receive the edge of the element having the contact points and at least one contact means normally biased to make physical and electrical contact with a contact point on the element when the element is in the slot. The receptacle also includes a cam means operable to cam the contact means to a position where it does not contact the element when the element is either partially or fully in the slot and means for operating the cam means. When the cam means is operated the element may be inserted or removed from the slot without the contact exerting any force on the element.

The foregoing and other objects, features and advantages of the invention will be apparent from the following more particular description of preferred embodiments of the invention, as illustrated in the accompanying drawings.

Figure 1:
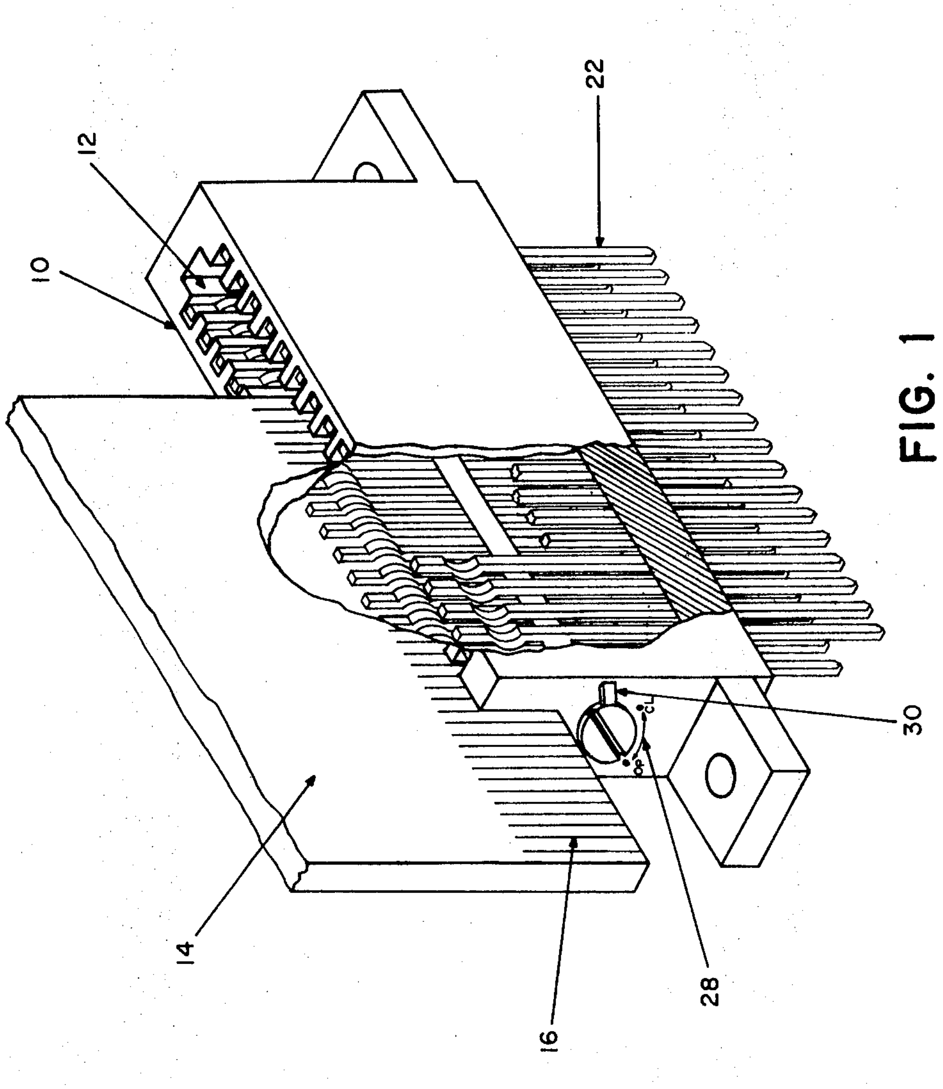
FIG. 1 is a partially cutaway perspective view of a preferred embodiment of the invention.

Referring now to FIG. 1 it is seen that receptacle 10 has a slot 12 in which a flat circuit bearing element 14, which for the purposes of the present discussion will be considered to be a printed circuit board, may be inserted. Board 14 has a plurality of terminal strips 16 formed in the lower edge thereof. While only one side of board 14 may be seen in FIG. 1, it will be assumed that board 14 also has terminal strips 16 on its opposite side.

Figure 3:
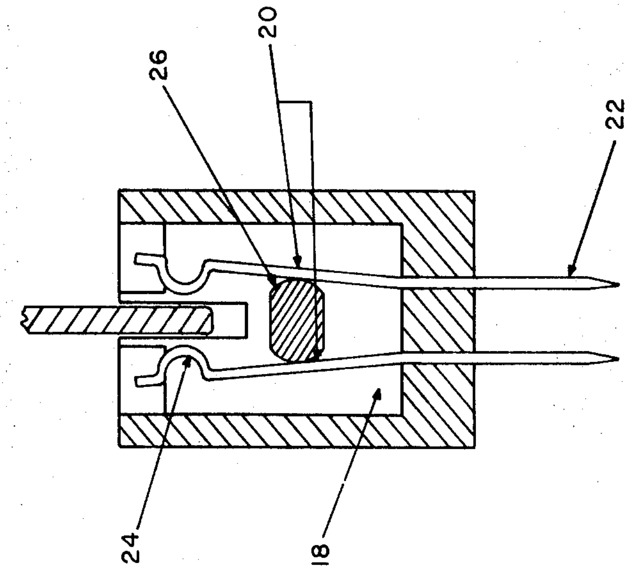
FIGS. 2 and 3 are sectional views taken along the line 2—2 of FIG. 1, showing the receptacle contacts in their closed and opened positions respectively.
Figure 2:
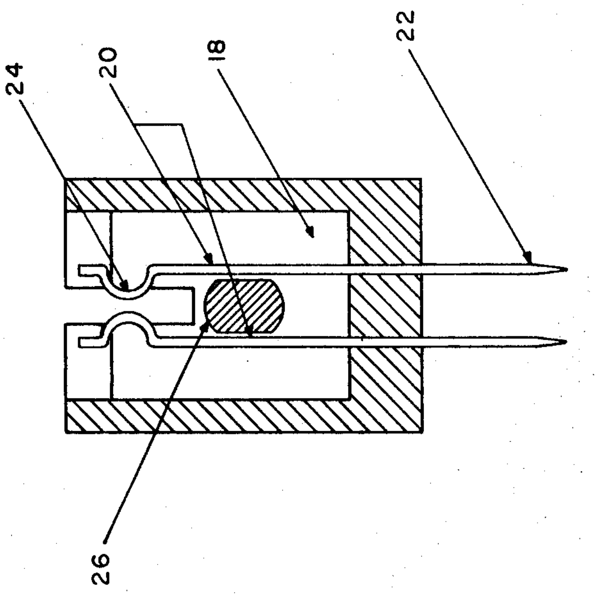

From the cutaway portion of FIG. 1, and from FIGS. 2 and 3, it can be seen that in addition to slot 12, receptacle 10 also includes a plurality of cavities 18, each of which has a pair of spring metal contact members 20 mounted therein. Each of the contacts 20 projects through a hole in the bottom of receptacle 10 and is retained thereto. The tail 22 of each contact 20 may, for example, be plated with a precious metal such as gold and utilized to connect the receptacle to other circuit elements in any conventional manner. Each contact 20 has an indentation or a dimple 24 which, when the contact is in its normal, unoperated position, as shown in FIG. 2, projects into slot 12. The raised portion of dimple 24 is adapted to make contact with a board when it is in slot 12 and may also be plated with a precious metal.

An actuating rod 26 passes through receptacle 10 between each pair of contacts 20. This rod is generally rectangular in shape with rounded edges and terminates in a screwhead 28 which projects out from either or both ends of receptacle 10. When screwhead 28 is turned to its open position as shown in FIG. 1, the short sides of actuating road 28 are essentially parallel with contact arm 20 as shown in FIG. 3 and the contact arms are effectively cammed apart moving dimples 24 out of slot 12. When head 28 is turned approximately 90° to its close position, the long sides of rod 26 are essentially parallel with contact arms 20, and the arms are permitted to return to their normal position as shown in FIG. 2. In this position, contact dimples 24 of contact arms 20 are in slot 12 and may make contact with the terminal strips of a circuit board position therein. It should be noted that when a board is in slot 12, it will prevent arms 20 from returning fully to the position shown in FIG. 2. The force exerted by the contacts on the board is determined by the strength of spring arms 20 and is relatively independent of the thickness of board 14.

Since significant damage may be done both to circuit board 14 and contacts 20 if an attempt is made to insert or remove the board when the receptacle is in its close condition, an arm 30 is mounted on rod 26 and rotates with it. When the receptacle is in its open condition, as shown in FIG. 1, arm 30 is in the position shown in the figure. However, when screw head 28 is turned 90° to its close position, arm 30 rotates 90° counterclockwise to a position in which it blocks the end of slot 12. With arm 30 in this position, it is not possible to either insert of remove a board from the receptacle.

Figure 4:
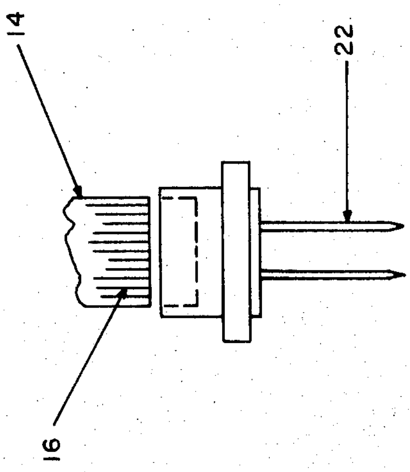
FIG. 4 is a front view of a slightly modified embodiment of the invention.

In FIG. 1, slot 12 has been shown as open at one end and a board is adapted to be inserted from the side of the receptacle. FIG. 4 shows a receptacle which is identical to that shown in FIG. 1 except that it is adapted to have a board inserted from the top rather than from the side. The manner in which actuating rod 26 controls contacts 20 to permit insertion and removal of boards with zero force is identical for both embodiments of the invention.

Figure 5:
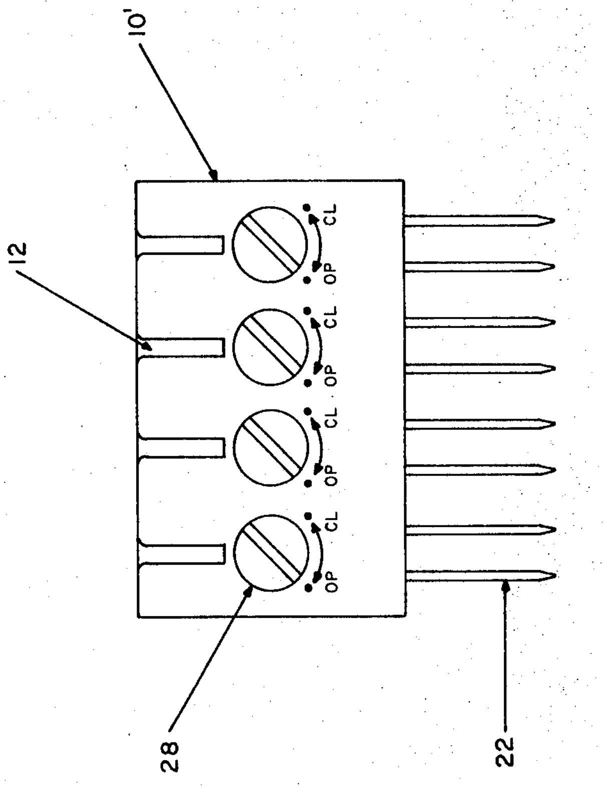
FIG. 5 is a side view of a second modified embodiment of the invention.

Receptacle 10 of FIG. 1 is adapted to receive only a single printed circuit board. FIG. 5 shows a receptacle 10' which is adapted to receive four printed circuit boards. Each of the slots 12 of this receptacle is identical to the slot 12 shown in Fig. 1 and the heads 28 shown in this figure are each attached to an actuating rod 26 which is identical to that shown in FIGS. 1—3. It is apparent that a receptacle could be provided which is adapted to receive various desired numbers of boards with independent means being provided to control the insertion and removal force of each individual board. Similarly, a single actuating rod 26 might be utilized to control the contacts for more than one board where the boards are positioned end to end in a suitable receptacle.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A receptacle for a flat circuit bearing element having contact points along at least one edge thereof comprising:

- a slot adapted to receive the edge of said element having said contact points;
- at least one contact point mounted in said receptacle to be moved between a first position in which it makes physical and electrical contact with a contact point of said element when said element is in said slot and a second position in which it makes substantially no contact with said element contact point;
- cam means operable for controlling the movement of said contact between said first and second positions; and
- means operative when said contact is in said first position for preventing an element from being inserted in said slot.

2. A receptacle of the type described in claim 1 wherein said cam means is operated by rotating it a predetermined number of degrees; and

- wherein said element insertion preventing means rotates between a blocking and nonblocking position as said cam means is rotated between an angle to bring said contact to said first position and an angle to bring said contact to said second position.